United States Patent [19]

Lim et al.

[11] Patent Number: 5,369,608
[45] Date of Patent: Nov. 29, 1994

[54] APPARATUS FOR RELIEVING STANDBY CURRENT FAIL OF MEMORY DEVICE

[75] Inventors: Young H. Lim, Taegu; Hyong G. Lee, Suweon, both of Rep. of Korea

[73] Assignee: Samsung Electronics Co., Ltd., Kyungki, Rep. of Korea

[21] Appl. No.: 964,620

[22] Filed: Oct. 23, 1992

[51] Int. Cl.$^5$ .............................................. G11C 11/40
[52] U.S. Cl. .................................. 365/104; 365/184; 365/201; 365/182; 365/185
[58] Field of Search ............... 365/185, 104, 184, 201, 365/182

[56] References Cited

U.S. PATENT DOCUMENTS 4,489,400 12/1984 Southerland, Jr. .................. 365/104
5,075,890 12/1991 Itoh et al. ............................ 365/185

*Primary Examiner*—Eugene R. LaRoche
*Assistant Examiner*—Huan Hoang
*Attorney, Agent, or Firm*—Stephen R. Whitt; Robert A. Westerlund

[57] ABSTRACT

An apparatus for relieving the standby current fail of a memory device which completely relieves a memory device by suppressing the increasing standby current consumption when the standby current is failed by stress during or after fabricating process without any change of standby conditions in a memory device having NAND-type cell array structure, and by using the other data correcting way. By connecting the transistors for the ground string selecting operation in series to the string transistors in order to selectively form the electrical path between the transistor connected to the word line and the ground node, even though the breakdown of the NAND cell occurs, the standby current fail can be prevented by selectively turning on or off the current path in response to the address decoding signal.

4 Claims, 2 Drawing Sheets

APPARATUS FOR RELIEVING STANDBY CURRENT FAIL OF MEMORY DEVICE

BACKGROUND OF THE INVENTION

The present invention relates to an apparatus for relieving the standby current fail of a memory device and, more particularly to an apparatus which completely relieves a memory device by suppressing the increasing standby current consumption when the standby current is failed by stress during or after fabricating process without any change of standby conditions in a memory device having NAND-type cell array structure, and by using the other data correcting way.

In the memory device having the NAND-type array cell, the word line voltage is above the threshold voltage of an enhancement cell for a selected cell (logic 'H'), but below the threshold voltage of the enhancement cell for an unselected cell (logic 'L'). In the standby mode of such a memory device, most of the word lines are in the logic 'H' level, while the selected word lines by an input address applied to a chip are in logic 'L' level. Thus, in the conventional memory devices having the NAND-type cell array which use polysilicon as the word lines, most of the cells are stressed by high voltage applied to the word lines during operation. This stress destroys the gate oxide of the transistors connected to the word lines, making the data reading of the cells impossible. These problems can be corrected by data correcting way such as redundancy and error correction code. But, because the voltage of the word lines holds high in the standby mode of the chip, the direct current path is formed through the destroyed parts of the cells, thereby causing the standby current fail.

FIG. 1 shows the circuit diagram of an embodiment of a conventional NAND cell array having N string selectors.

In FIG. 1, N string selectors ST1-STn are prepared, and to each string, bit lines B/L1-B/Ln and word lines W/L1-W/Ln are also prepared.

In normal data read mode, only one of the first and second string selectors SS1 and SS2 becomes the logic 'H' level and one selected word line becomes the logic 'L' level. In FIG. 1, m1 is an enhancement N-channel MOS transistor having a positive threshold voltage value, m2 is a depletion N-channel MOS transistor having a negative threshold voltage value, and m3-m6 having the enhancement or the depletion threshold voltage value according to programs.

For example, if the first string selecting signal SS1 and the second word line W/L2 were selected, according to address decoding, the voltage of the first string selecting signal SS1 is in the logic 'H' level, and that of the second string selecting signal SS2 is in the logic 'L' level. At this time, only the second word line W/L2 is in the logic 'L' level, and the other word lines W/L1-W/Ln are all in the logic 'H' level. Then, the transistors m1 and m2 are turned on, and the transistor m7 is turned off. As a result, the first bit line B/L1 is electrically connected to a node A, but disconnected with a node B by the transistor m7 being in cut-off state. Thus, the node B is floating. Also, the transistors m3, m5, m6 are always in turn-on state independent of program state, and the electrical connection of them to a ground node C' is determined according to the threshold voltage of the transistor m4 which uses the second word line W/L2 as the gate. If the transistor m4 is the depletion N-channel MOS transistor, it is turned on, even though the voltage of the second word line W/L2 is in the logic 'L'. Thus, electrical path is formed between the first bit line B/L1 and the ground node C. By contrast, if m4 is the enhancement N-channel MOS transistor, it is turned off, forming no electrical path between the first bit line B/L1 and the ground node C'. The state of the cell selected by this decoding is read out by a sense amplifier connected to the first bit line B/L1 (not shown in FIG. 1).

In this circuit shown in FIG. 1, when the chip is in the standby mode, both the first and second string selecting signals SS1 and SS2 are in the logic 'L' level and all the word lines W/L1-W/Ln are in the logic 'L' level. Thus, if the gate insulator (silicon dioxide) of the transistor m4 is destroyed by the stress due to the high voltage applied to the word lines or the process defects, the current path is formed from the second word line W/L2 through the transistors m5 and m6. In this case, the transistor m4 can be relieved using the redundancy or the error correction code but in the standby mode, the current consumption of the chip is too large. Thus, the chip can not be relieved completely.

SUMMARY OF THE INVENTION

An object of the present invention is to provide an apparatus for relieving the standby current fail of a memory device which completely relieves a chip by cutting off the current path to the ground when the dielectric breakdown of a cell occurs irregularly due to the stress during or after the fabricating process, in order to prevent the increase of the standby current, and by using the data correcting way.

According to the present invention, there is provided an apparatus for relieving the standby current fail of a memory device, wherein an NAND cell array comprises strings of which one transistor series is selected by string selectors, bit lines for driving of the strings, and word lines for making the level of one transistor different from other transistors according to decoding signals, and each string is selectively connected to the ground by switching part to form the current path.

DETAILED DESCRIPTION OF THE INVENTION

Figure 1:
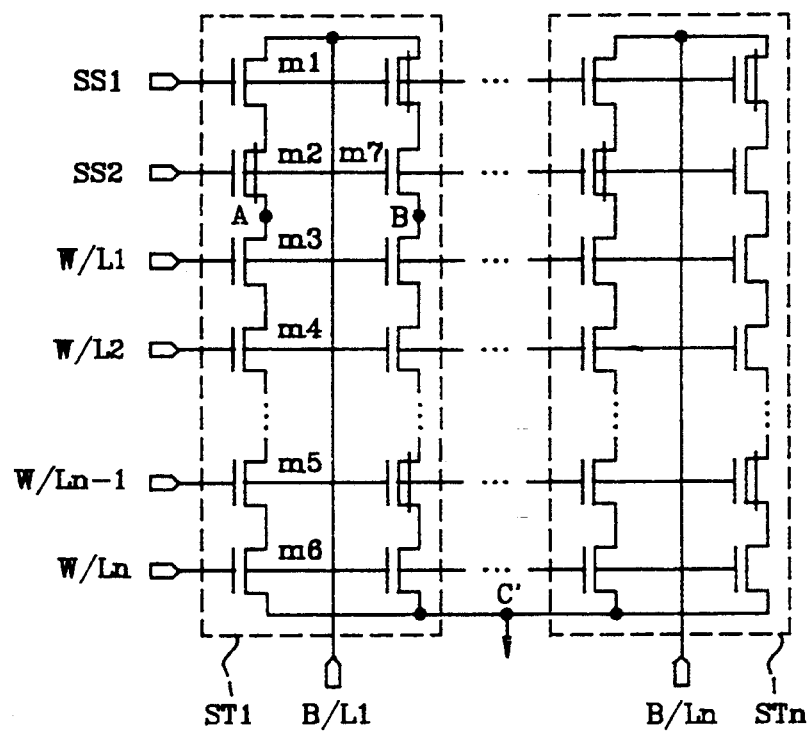
FIG. 1 is a circuit diagram of a conventional NAND cell array.
Figure 2:
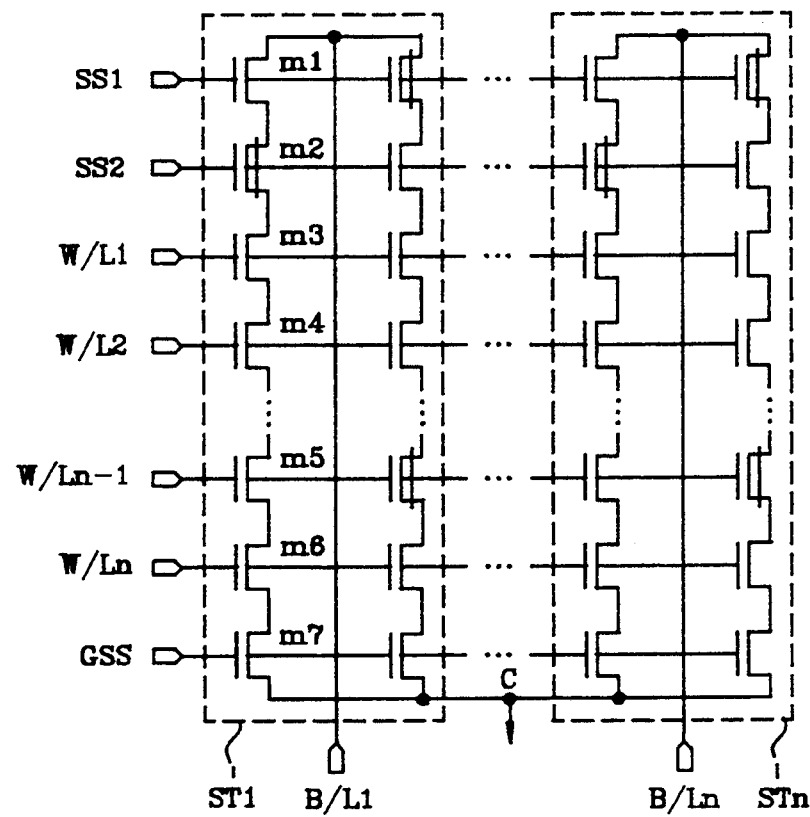
FIG. 2 is a circuit diagram of an NAND cell array according to the present invention.

FIG. 2 shows a circuit diagram of an NAND cell according to the present invention, which is not programmed and is composed by adding ground string selecting transistors m7 to the NAND cell array shown in FIG. 1 where two string selecting signals SS1 and SS2 enter, bit lines B/L1-B/Ln are prepared to each string selectors ST1-STn, and word lines W/L1-W/Ln are connected to transistors m1-m6.

The transistor m7 is the enhancement N-channel MOS transistor, which is used as the switching part for turning on or off the current path between the transistors m5 and m6 and a node C. This transistor is prepared in each string and is turned on or off by a ground string selecting signal GSS.

In this composition of circuit, even if the transistors selected by the word lines W/L1-W/L2, the bit lines B/L1-B/Ln, and the first and the second string selecting signal SS1 and SS2, form the current path toward the ground in the standby mode, the transistors m7 are turned on or off by the ground string selecting signal GSS. Thus, if the transistors m7 are turned off in the standby mode and turned on in the read mode if necessary, the increase of current due to dielectric breakdown in the standby mode is prevented. That is, the current path to the ground is cut off by the transistors m7.

Figure 3:
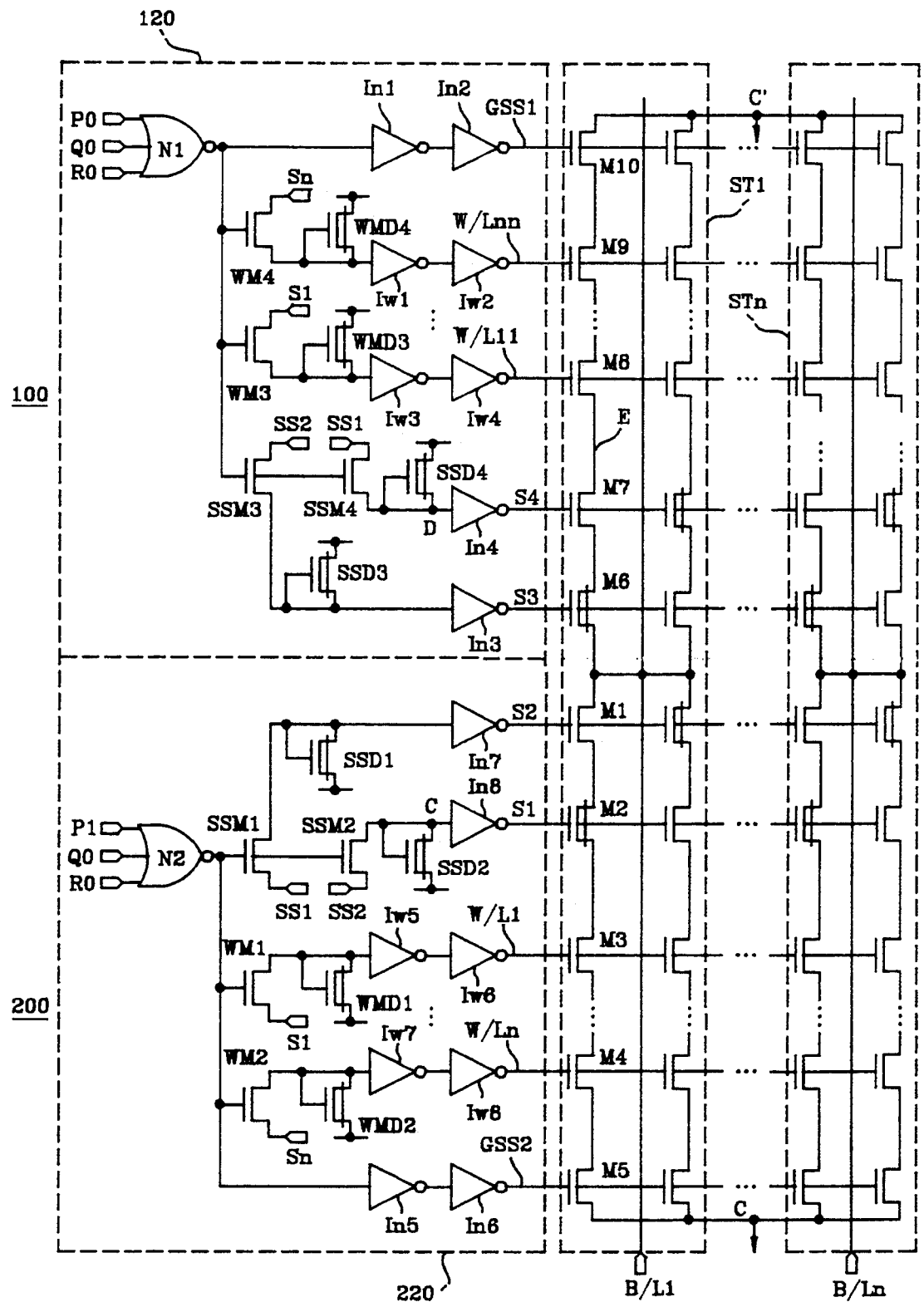
FIG. 3 is a detailed circuit diagram of an embodiment of FIG. 2.

FIG. 3 is a preferred embodiment of FIG. 2. A first block 100 and a second block 200 include N string means ST1-STn each comprised of a NAND cell array and commonly connected to bit lines B/L1-B/Ln, and decoding circuits 120 and 220 which output a decoding signal to cause the string means ST1-Stn to carry out a ground string selection, in a manner described hereinafter. The first block 100 and the second block 200 are separately operated in accordance with logic signals outputted from NOR gates N1, N2 within the decoding circuits 120, 220, respectively.

According to this configuration, the block to be operated is selected by the address decoding signal applied to the input terminal of the decoding circuits 120 and 220. One of the N string means ST1-Stn is selected by the string selecting signals SS1 and SS2. One of the word lines W/L1-W/Ln is selectively driven by the word line decoding signals S1-Sn. The logic level of the ground string selecting signals GSS1 and GSS2 is determined in accordance with the logic signals outputted from NOR gates N1 and N2. Depending upon the state of the logic signals outputted from the NOR gates N1 and N2, the current path to ground is either established or suppressed, by virtue of the ON/OFF operation of transistors M10 and M5.

In the decoding circuit 120, two inverters In1 and In2 are used to turn off the transistor m10 by using the output signal of the NOR gate N1 in the standby mode, and transistors SSM3 and SSD3, and SSM4 and SSD4 which are turned on or off by the string selecting signals (i.e., address decoding signals) SS1 and SS2, are connected to transistors m6 and m7 through inverters In3 and In4, respectively. Also, in the word line composition, one word line W/L1 is driven by transistors MW3 and MWD3 which are turned on or off by address decoding signal S1-Sn and inverters Iw1 and Iw2. Similarly, the word line W/Ln is driven by transistors WM4 and WMD4 and inverters Iw3 and Iw4. The block 200 also has the same decoding circuit 220 composed of transistors WM1, WM2, WMD1, WMD2, SSM1, SSM2, SSD1, and SSD2 and inverters In5-In8 and Iw5-Iw8, which is driven by the NOR gate N2 the output signal of which is determined by the address decoding signals.

In FIG. 3, M5 and M10 are transistors for the ground string selection.

In this composition of the present invention, because the bit lines B/L1-B/Ln are connected in common to the strings ST1-STn in the first and second blocks 100 and 200, one block is selected by the address decoding signal and one word line of the selected block is selected by the address word line selecting signals S1-Sn.

For example, if all input signals PO, QO, and RO of the NOR gate N1 are all in the logic 'H' level, the output signal of the NOR gate N1 becomes the logic 'L' level, that is, the standby mode. Then, the gate of the transistor m10 also becomes the logic 'L' level through the two inverters In1 and In2, thereby being turned off. Thus, although the bit line B/L1 is selected, the current path through m6-m10 to the ground node C' is cut off. Similarly, even when the inputs PO, QO, and RO of the NOR gate N2 in the block 200 are all in the logic 'H' level, the current path is cut off in the same way.

That is, because the ground string selecting signal becomes the logic 'L' level and thus the transistor m5 is turned off, the current path through m1-m5 to the ground node C' is cut off even though the bit line B/L1 is selected.

If one of the two NOR gates N1 and N2 is selected to be driven, the corresponding ground string selecting signal becomes the logic 'H' level, forming the current path.

On the other hand, if the input signals PO, QO, and RO of the NOR gate N1 are in the logic 'L' and the input signal P1 of the NOR gate N2 is in the logic 'H' level, the NOR gate N2 outputs the logic 'L' level identical to the standby mode in order not to drive the second block 200, while the NOR gate N1 outputs the logic 'H' level, turning on the transistor m10 in the first block 100.

At this time, assuming that the string selecting signal SS1 is in the logic 'L' level, SS2 in the logic 'H' level, the address decoding signal S1 in the logic 'L' level, and Sn in the logic 'H' level, if the current provided from the transistor SSD4 flows to the string selecting signal node SS1 through SSM4, the output signal of the inverter IN4 becomes the logic 'H' level and thus the bit line B/L1 is electrically connected to a node E through the transistors m6 and m7. At this time, because the address word line decoding signal S1 is in the logic 'L' level, the current provided from the transistor WMD3 is synchronized through the transistor WM3, the word line W/L1 is changed to the logic 'L' level and the ground string selecting signal GSS1 of the logic 'H' level is applied to the gate of the transistor m10. Thus, according to the threshold voltage of the transistor m8, i.e., either enhancement or depletion, the formation of the electrical path between the bit line B/L1 and the ground node is determined.

On the other hand, when the dielectric breakdown occurs between the gate and the drain of the cell and the error is repaired by the error correction code circuit, even though the current path to the ground is formed due to the destroyed cell in the standby mode, the transistor m10 connected to the ground string selecting signal is in turn-off state, thereby cutting off current path to the ground. That is, the standby current fail does not occur.

Of course, in the operation of the second block 200, the same effect occurs. At this time, the transistor m5 carries out the ground string selecting operation so that even when one of the transistors m1-m4 is dielectrically destroyed, the standby current fail does not occur.

Also, the transistors m5 and m10 for the ground string selecting operation, are connected to the ground nodes C and C' in the read mode. Thus, the transistors have no effect in the read mode. Here, the decoding circuits 120 and 220 can be replaced by other circuit composition, and FIG. 3 is only one embodiment of the present invention.

As described hereinabove, according to the apparatus for relieving the standby current fail of a memory device of the present invention, because the transistors for the ground string selecting operation are connected in series to the string transistors in order to selectively form the electrical path between the transistor connected to the word line and the ground node, even though the breakdown of the NAND cell occurs, the standby current fail can be prevented by selectively turning on or off the current path according to the address decoding signal. Accordingly, because the NAND cell array is completely relieved by the data correcting way, the fail ratio of semiconductor memory devices is largely decreased, improving the yield. In addition, the present invention has an advantage in that the ground string selecting transistor is composed in one transistor series without large change of the NAND cell array structure, thereby being easily applicable to the conventional NAND cell array.

What is claimed is:

1. An apparatus for preventing standby current failure of a memory device, including:
   a plurality N of string means each comprised of a NAND cell array of memory cells, each one of said memory cells including a MOS transistor having a single gate, and each of said string means being commonly connected to a respective one of a corresponding plurality N of bit lines;
   a first block and a second block, each comprising:
   a plurality of word lines commonly connected to said NAND cell array of each of said plurality N of string means;
   word line decoding means for selectively activating a selected one of said word lines;
   a ground selection line commonly connected to said NAND cell array of each of said plurality N of string means; and,
   switching means connected between said ground selection line and ground;
   block decoding means for selectively activating a selected one of said first and second blocks, wherein said word line decoding means of said selected block is enabled and said switching means of said selected block is turned on, and said switching means of the non-selected block is turned off, thereby preventing standby current failure of the memory device by suppressing a current path to ground in said non-selected block.

2. The apparatus as set forth in claim 1, wherein said block decoding means comprises a first NOR gate connected to said word line decoding means and said switching means of said first block, and a second NOR gate connected to said word line decoding means and said switching means of said second block.

3. The apparatus as set forth in claim 2, wherein said first NOR gate includes a plurality of input terminals for receiving a corresponding plurality of input control signals, and said second NOR gate includes a plurality of input terminals for receiving a corresponding plurality of input control signals.

4. The apparatus as set forth in claim 1, wherein said switching means of said first block comprises a plurality of transistors connected between a first ground terminal and said NAND cell array of respective ones of said plurality of string means, and said switching means of said second block comprises a plurality of transistors connected between a second ground terminal and said NAND cell array of respective ones of said plurality of string means.

* * * * *